United States Patent
Zhong et al.

(10) Patent No.: US 11,094,611 B2
(45) Date of Patent: Aug. 17, 2021

(54) LIQUID COOLED HEAT DISSIPATION DEVICE

(71) Applicant: CHAMP TECH OPTICAL (FOSHAN) CORPORATION, Foshan (CN)

(72) Inventors: Zhen-Quan Zhong, Foshan (CN); Qiao-Long Chen, Foshan (CN); Meng Fu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 16/677,248

(22) Filed: Nov. 7, 2019

(65) Prior Publication Data
US 2021/0104450 A1  Apr. 8, 2021

(30) Foreign Application Priority Data
Oct. 8, 2019 (CN) .......................... 201910951320.8

(51) Int. Cl.
*F28D 15/00* (2006.01)
*H01L 23/473* (2006.01)
*F28F 3/02* (2006.01)

(52) U.S. Cl.
CPC ............ *H01L 23/473* (2013.01); *F28F 3/025* (2013.01)

(58) Field of Classification Search
CPC ..... H01L 23/46; H01L 23/473; F28F 2215/06
USPC ........................................... 165/80.4, 104.21
See application file for complete search history.

(56) References Cited

U.S. PATENT DOCUMENTS

| | | | | |
|---|---|---|---|---|
| 3,800,868 A * | 4/1974 | Berkowitz | ................ | F28F 3/12 165/170 |
| 7,040,383 B2 * | 5/2006 | Oyamada | ............... | H05K 5/068 165/104.21 |
| 7,500,513 B2 * | 3/2009 | Zhang | ................. | B23K 1/0012 165/76 |
| 7,661,463 B2 * | 2/2010 | Liu | ....................... | H01L 23/427 165/104.14 |
| 7,965,511 B2 * | 6/2011 | Refai-Ahmed | ....... | H01L 23/427 361/700 |
| 8,737,071 B2 * | 5/2014 | Hao | .......................... | G06F 1/20 361/700 |
| 10,077,946 B2 * | 9/2018 | Sun | ..................... | F28D 15/0275 |
| 10,641,556 B1 * | 5/2020 | Al Omari | ............... | F28D 15/02 |
| 2001/0047859 A1 * | 12/2001 | Ishida | ................. | F28D 15/0283 165/104.14 |
| 2002/0056908 A1 * | 5/2002 | Brownell | ............. | H05K 1/0209 257/714 |
| 2002/0118511 A1 * | 8/2002 | Dujari | ................. | F28D 15/0233 361/703 |

(Continued)

FOREIGN PATENT DOCUMENTS

TW 534378 5/2003
TW 200530552 9/2005

*Primary Examiner* — Claire E Rojohn, III
(74) *Attorney, Agent, or Firm* — ScienBiziP, P.C.

(57) ABSTRACT

A heat dissipating device which is liquid cooled includes a base and at least one heat dissipation fin connected to the base. The base includes a first cavity. The at least one heat dissipation fin comprising a second cavity communicating with the first cavity, the second cavity and the first cavity together form an accommodation cavity for accommodating a working fluid which forcefully applies cooling upon being heated sufficiently to be vaporized.

13 Claims, 2 Drawing Sheets

(56) References Cited

U.S. PATENT DOCUMENTS

| | | | |
|---|---|---|---|
| 2004/0190253 A1* | 9/2004 | Prasher | G06F 1/203 |
| | | | 361/699 |
| 2005/0051300 A1* | 3/2005 | Searls | C09K 5/063 |
| | | | 165/104.21 |
| 2005/0199376 A1* | 9/2005 | Lee | F28D 15/0233 |
| | | | 165/104.26 |
| 2007/0012429 A1* | 1/2007 | Siu | F28F 21/062 |
| | | | 165/104.33 |
| 2007/0025085 A1* | 2/2007 | Chang | F28D 15/0233 |
| | | | 361/704 |
| 2007/0258213 A1* | 11/2007 | Chen | F28D 15/0233 |
| | | | 361/701 |
| 2009/0040726 A1* | 2/2009 | Hoffman | F28D 15/0233 |
| | | | 361/700 |
| 2009/0185343 A1* | 7/2009 | Wu | H01L 23/473 |
| | | | 361/679.53 |
| 2016/0356562 A1* | 12/2016 | Terada | F28F 21/084 |

* cited by examiner

LIQUID COOLED HEAT DISSIPATION DEVICE

FIELD

The subject matter herein generally relates to cooling systems.

BACKGROUND

Heat is generated during operations of electric products such as computers, notebooks or touch pads, chips, such as CPU, GPU. Heat has to be quickly carried away from the chips during operation. Excessively high temperature causes abnormal operation of the chips. Various cooling means, such as cooling systems, have been developed but none are optimal.

BRIEF DESCRIPTION OF THE DRAWINGS

Implementations of the present technology will now be described, by way of embodiments only, with reference to the attached figures.

DETAILED DESCRIPTION

Figure 1:
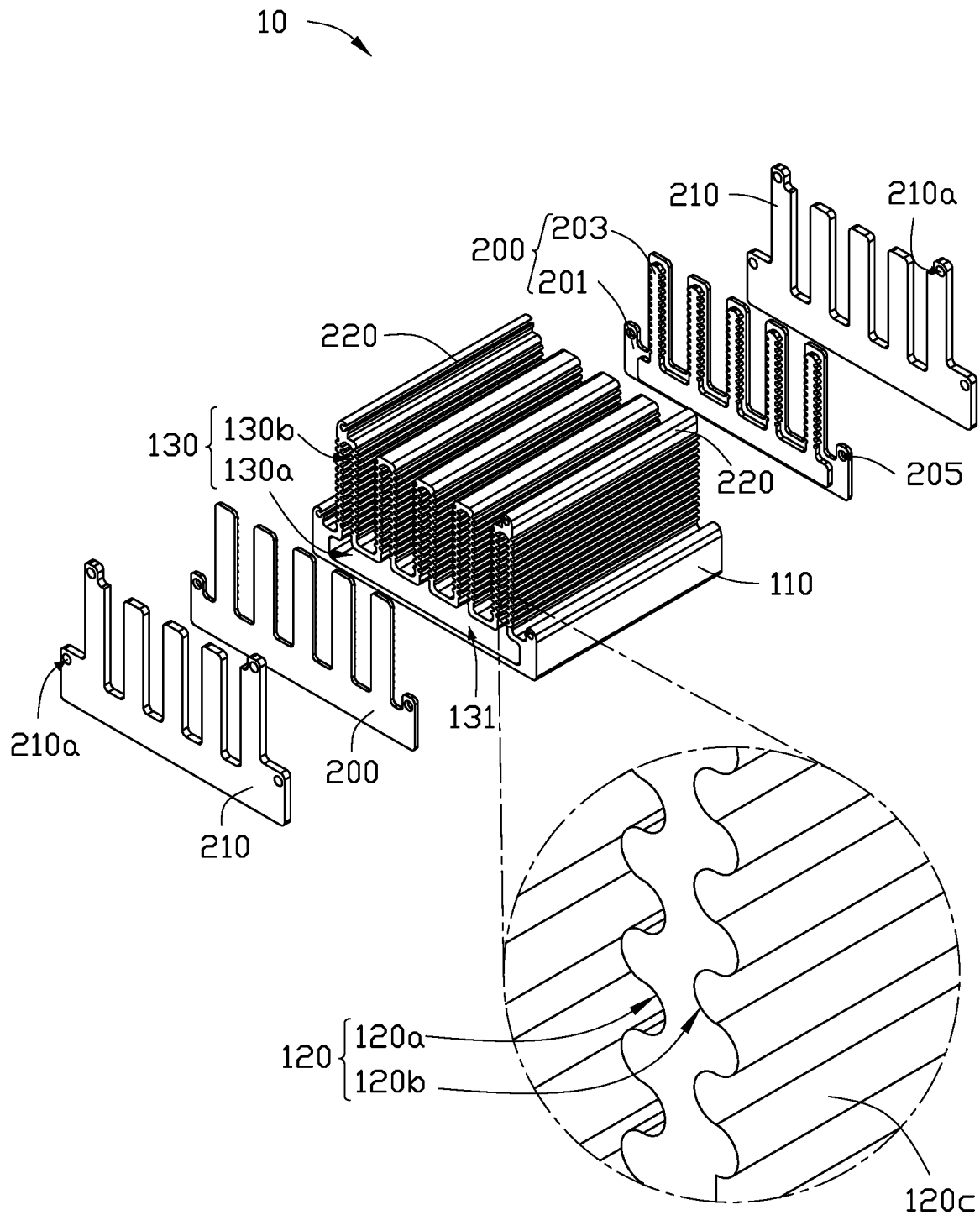
FIG. 1 is an isometric view of a liquid cooled heat dissipation device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Refer to FIG. 1, the liquid cooled heat dissipation device 10 includes a base 110 and at least one heat dissipation fin 120 connected to the base 110. The base 110 and the at least one heat dissipation fin 120 integrally formed in a mold. The base 110 and the heat dissipation fins 120 are formed by an extrusion process. The base 110 contacts a heat source, to transmit heat from the heat source. The liquid cooled heat dissipation device 10 is made of material with high heat conductivity, such as copper or aluminum.

In the embodiment, the liquid cooled heat dissipation device 10 includes a plurality of heat dissipation fins 120. The heat dissipation fins 120 protrude from top surface of the base 110 and the plurality of heat dissipation fins 120 are having same size and space from, and are roughly parallel to each other. In other embodiment, the dissipation fins 120 have different sizes and heights.

The base 110 is a substantially plate shaped and includes a first cavity 130a. Each heat dissipation fin 120 includes a second cavity 130b communicating with the first cavity 130a. The second cavity 130b and the first cavity 130a cooperatively form an accommodation cavity 130 for accommodating a working fluid, and the working liquid can be a phase-changing liquid. Each heat dissipation fin 120 includes an outer wall 120b and an inner wall 120a opposite to the outer wall 120b, the inner wall 120a faces the second cavity 130b, and the outer wall 120b deviates from the second cavity 130b. One of the outer wall 120b and the inner wall 120a of each heat dissipation fin 120 is provided with a plurality of protruding structures 120c. In the embodiment, both the outer wall 120b and the inner wall 120a are provided with the protruding structures 120c, and in the embodiment, the protruding structures 120c are extended along an length direction of the heat dissipation fins 120, and a shape of the protruding structures 120c is arc. In other embodiment, the first cavity 130a can be omitted, and the working fluid is only received in the second cavity 130b.

Surface of the heat dissipation fin 120 alternates between concave and convex because of the protruding structures 120c formed on the inner wall 120a and/or the outer wall, and surface area of the heat dissipation fin 120 relative to the plane surface is increased. Thereby, the protruding structures 120c increase a heat dissipation surface area of each heat dissipation fin 120. The protruding structures 120c provided on the inner wall 120a and the outer wall maximize an internal and outer surface area of the heat dissipation fins 120, and an effect of heat dissipating is improved. In this embodiment, each protruding structure 120c is a strip, and in other embodiments, the protruding structure 120c may be of other shapes that can increase the surface area of the heat dissipation fin 120, such as protruding islands, etc.

Referring to FIG. 1 again, the accommodation cavity 130 runs through at least one end of the base 110, and an opening 131 is defined in at least one end of the base 110, and a sealing member 200 is provided to seal the opening 131.

In the embodiment, the accommodation cavity 130 runs through two opposite ends of the base 110 and two of the outermost heat dissipation fins 120, and the liquid cooled heat dissipation device 10 includes two openings 131, each opening 131 is sealed by one sealing member 200. The sealing member 200 can be a rubber plate, or metal plate or solder paste which can be soldered to the base 110 and the heat dissipation fins 120. Any material that can facilitate heat dissipation and seal the opening can be used here. In the embodiment, the sealing member 200 is a plate and comprises a mounting plate portion 201 and a sealing plate portion 203 formed on inner side of the mounting plate portion 201 for matching the opening 131, the mounting plate portion 201 comprises positioning portions 205.

In the embodiment, an outer side of each sealing member 200 is provided with a baffle 210 for protecting the liquid cooled heat dissipation device 10. The baffle 210 can shelter the first cavity 130a and the second cavity 130b, and each baffle 210 is provided with four first positioning portions 210a. The two outermost heat dissipation fins 120 and the two opposite base 110 are respectively provided with two second positioning portions 220 corresponding to the first positioning portions 210a. The baffle 210 may be fixed and fastened to the liquid cooled heat dissipation device 10 through the first positioning portions 210 matching with the second positioning portions 220 or may use a fastener passing through first positioning portions 210 matching with the second positioning portions 220.

In particular, the sealing member 200 provided by the liquid cooled heat dissipation device 10 in the present embodiment is intended to seal the first cavity 130a and the second cavity 130b and to facilitate cleaning of the inner wall of the liquid cooled heat dissipation device 10. If it is not necessary to clean the inner wall 120a (permanent or disposable liquid cooled heat dissipation device 10), the sealing member 200 may not be provided, but the first cavity 130a and the second cavity 130b may be sealed directly, and the effect is the same as that of the sealing member 200. Therefore, the seal of the liquid cooled heat dissipation device 10 of the present embodiment includes, but is not limited to, the sealing mode such as setting of the sealing member 200 or direct welding. If there is no greater demand for the safety of the liquid cooled heat dissipation device 10 in the installation environment, the baffle 210 may also be selected according to the actual demand.

In the present embodiment, the working liquid is a phase-changing liquid with endothermic vaporization, and the phase-changing liquid is a liquid that uses the change of phase state to emit heat. In at least one embodiment, the phase-changing liquid may be water, alcohol, or air. In this embodiment, when temperature of the base 110 is not less than 60 degrees Celsius, the phase changing liquid will vaporize and absorb heat.

The working fluid may be injected into the liquid cooled heat dissipation device 10 by first sealing one opening and then injecting the working liquid into the capacity cavity 130 at the other opening 131, and then sealing the opening 131 with the sealing member 200. This liquid injection mode is suitable for a disposable or permanent hot-cooled radiator 10.

When the base 110 contacts a heat source, heat generated by the heat source is transmitted to the base 110, the working liquid located in the first cavity 130a absorbs heat from the base 110, and when the temperature of the base 110 reaches 60 degrees Celsius, the working liquid vaporizes. The vaporized working liquid enters the second cavity 130b and contacts the heat dissipating fins 120. At this time, the vaporized working liquid releases heat and condenses and aggregates in the inner wall of the heat dissipation fin 120, and then flows to the first cavity 130a, which absorbs heat and naturally dissipates heat outward. When the working liquid drops from the inner wall 120a of each heat dissipation fin 120 to the first cavity 130a, the cooled working fluid will continue to cool the base 110, and then vaporize again, so that the cooling efficiency of the liquid cooled heat dissipation device 10 can be greatly improved.

In order to better transfer heat of the working liquid to the heat dissipation fin 120, the protruding structure 120c is formed on the inner wall 120a and outer wall 120b of each heat dissipation fin 120, which not only maximizes the internal surface area and outer surface area of each heat dissipation fin 120, but also makes good use of the capillary force of the working fluid on the inner wall 120a. Under the action of capillary force, the working fluid attached to the protruding structure 120c on the inner wall 120a does not immediately drop to the base 110, thus increasing the contact time of the working liquid attached on the heat dissipation fins 120, and accordingly prolonging the heat exchange time of the working fluid and the heat dissipation fins 120, so that the working liquid can fully transfer heat to the heat dissipation fins 120, thus effectively improving the heat dissipation efficiency.

Figure 2:
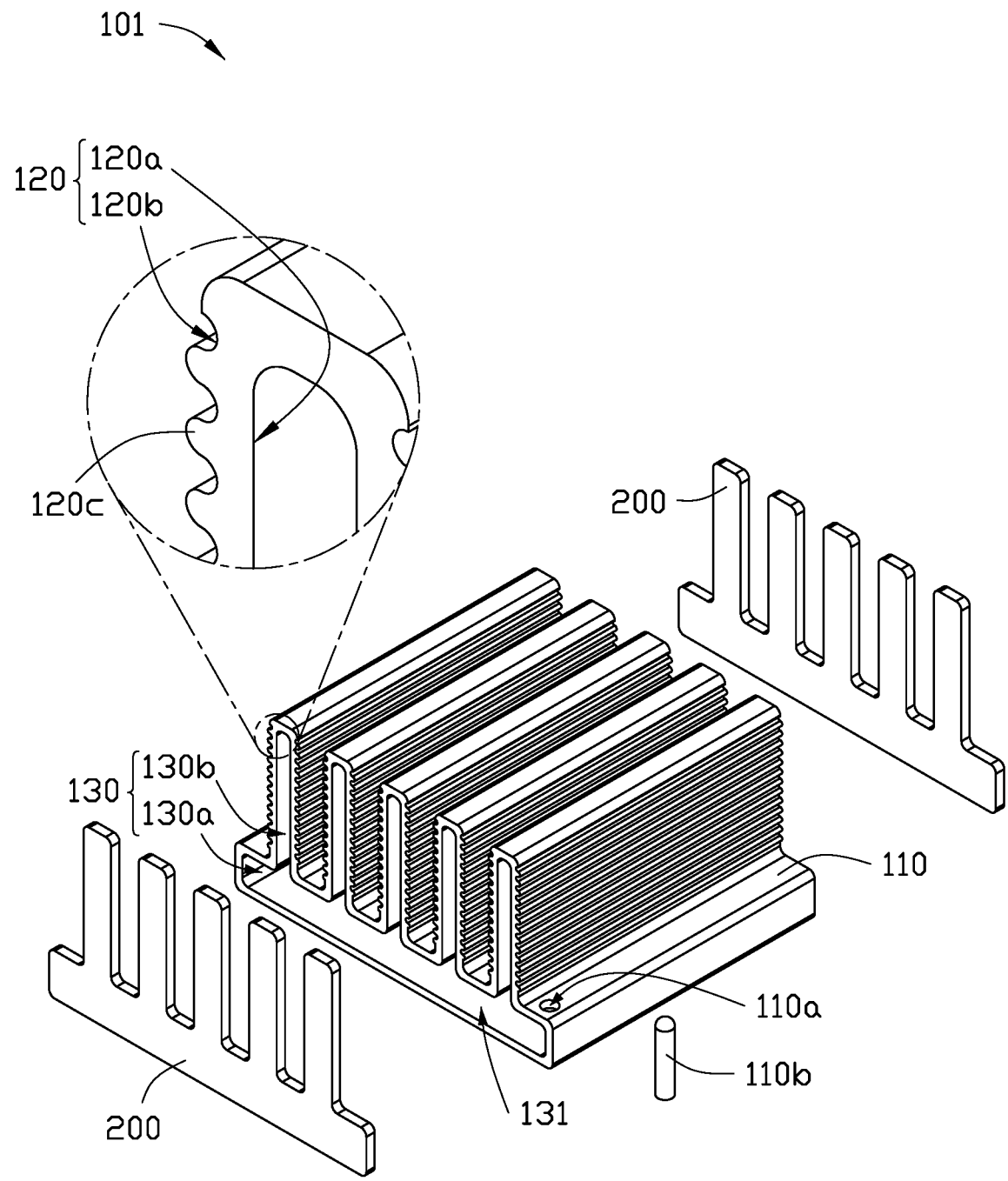
FIG. 2 is an isometric view of a liquid cooled heat dissipation device in accordance with another embodiment.

Referring to FIG. 2, FIG. 2 shows a liquid cooled heat dissipation device 101 according to another embodiment. The liquid cooled heat dissipation device 101 in FIG. 2 is similar to the liquid cooled heat dissipation device 10 in FIG. 1. The difference between the liquid cooled heat dissipation device 101 and the liquid cooled heat dissipation device 10 in FIG. 1 is that the protruding structure 120c is only formed on the outer wall 120b of each heat dissipation fin 120; in addition, the liquid cooled heat dissipation device 101 also includes a liquid injection hole 110a and a liquid injection tail tube 110b configured to seal the liquid injection hole 110a. The liquid injection hole 110a is formed on the base 110, and the liquid injection hole 110a is used for injecting working liquid into the first cavity 130a. The shape of the injection hole 110a is not limited to regular shape such as circle or square. The liquid injection hole 110a and the liquid injection tail pipe 110b are so arranged that the working fluid can be replaced at any time according to heat dissipation demand, thus making the liquid cooled heat dissipation device 101 more practical. If the liquid cooled heat dissipation device 101 does not need to replace the working fluid (that is, it is a permanent liquid cooled radiator or disposable liquid cooled radiator), the liquid injection hole 110a and the liquid injection tail tube 110b need not be provided, but an opening may be selected at either place on the base 110 or the heat dissipation fin 120, and then the selected working fluid may be injected into the first cavity 130a from the opening. Then the hole is welded and sealed. A heat dissipation effect is the same as that of setting the liquid injection hole 110a and the liquid injection tail tube 110b. Therefore, the liquid injection mode of the liquid cooled heat dissipation device 101 may be selected according to an actual demand.

As shown in FIG. 2, the accommodation cavity 130 of the liquid cooled heat dissipation device 101 is formed with at least one opening 131, and the opening 131 is sealed using the sealing member 200, and the sealing member 200 is detachable or directly welded for permanent fixation.

The base 110 and the heat dissipation fins 120 of the liquid cooled heat dissipation device 101 are manufactured by extrusion process, and the material is aluminum alloy, so the liquid cooled heat dissipation device 101 has a simple structure and a light weight. The liquid cooled heat dissipation device 101 is suitable for heat dissipation of high power elements and has high heat dissipation efficiency, so it plays a positive role in the heat dissipation of chips or systems in the existing electronic industry. The liquid injection mode may also make the practicability of the liquid cooled heat dissipation device 101 more flexible by setting the liquid injection hole 110a and the liquid injection tail tube 110b to replace the working fluid with corresponding characteristics at any time according to the heat dissipation demand.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A liquid cooled heat dissipation device comprising:
a base comprising a first cavity; and
at least one heat dissipation fin connected to the base;
wherein the at least one heat dissipation fin comprising a second cavity communicating with the first cavity, the second cavity and the first cavity cooperatively form an accommodation cavity for accommodating a working fluid, the liquid cooled heat dissipation device comprises a plurality of heat dissipation fins of a same size, the heat dissipation fins are spaced from and approximately parallel to each other, the accommodation cavity is defined through at least one end of the base, and an opening is defined at least one end of the base, a sealing member is provided to seal the opening, the sealing member is a plate and comprises a mounting plate portion and a sealing plate portion formed on the mounting plate portion for matching with the opening, the mounting plate portion comprises positioning portions, the two outermost heat dissipation fins are provided with positioning portions which correspond to the mounting plate portion on the sealing member.

2. The liquid cooled heat dissipation device of claim 1, wherein:
the base and the at least one heat dissipation fin are integrally formed in a mold.

3. The liquid cooled heat dissipation device of claim 1, wherein:
each of the heat dissipation fins comprises an outer wall and an inner wall opposite to the outer wall, the inner wall faces the second cavity, and the outer wall deviates from the second cavity, one of the outer wall and the inner wall of each heat dissipation fins is provided with a plurality of protruding structures.

4. The liquid cooled heat dissipation device of claim 1, wherein:
each of the heat dissipation fins comprises an outer wall and an inner wall opposite to the outer wall, the inner wall faces the second cavity, and the outer wall deviates from the second cavity, both the outer wall and the inner wall of each heat dissipation fins are provided with a plurality of protruding structures.

5. The liquid cooled heat dissipation device of claim 4, wherein:
the second cavity is U-shaped.

6. The liquid cooled heat dissipation device of claim 5, wherein:
a shape of the protruding structures is arc.

7. The liquid cooled heat dissipation device of claim 6, wherein:
the protruding structures are extended along an length direction of the heat dissipation fins.

8. The liquid cooled heat dissipation device of claim 1, wherein:
the plate is welded to the base.

9. The liquid cooled heat dissipation device of claim 1, wherein:
an outer side of each sealing member is provided with a baffle, the baffle has a same shape with the sealing member.

10. A liquid cooled heat dissipation device comprising:
a base; and
at least one heat dissipation fin protruding from top surface of the base;
wherein the at least one heat dissipation fin is U-shaped and comprises a second cavity for accommodating a working fluid, the second cavity comprises an outer wall and an inner wall opposite to the outer wall, the inner wall faces the second cavity, and the outer wall deviates from the second cavity, and wherein one of the outer wall and the inner wall of each heat dissipation fins or both the outer wall and the inner wall of each heat dissipation fins are provided with a plurality of protruding structures, the liquid cooled heat dissipation device comprises a plurality of heat dissipation fins of a same size, the plurality of heat dissipation fins are spaced from and approximately parallel to each other, the accommodation cavity is defined through at least one end of the base, and an opening is defined in at least one end of the base, and a sealing member is provided to seal the opening, the sealing member is a plate and comprises a mounting plate portion and a sealing plate portion formed on the mounting plate portion for matching with the opening, the mounting plate portion comprises positioning portions, the two outermost heat dissipation fins are provided with positioning portions which correspond to the mounting plate portion on the sealing member.

11. The liquid cooled heat dissipation device of claim 10, wherein:
the base comprises a first cavity communicating with the second cavity, the second cavity and the first cavity cooperatively form an accommodation cavity for accommodating the working fluid.

12. The liquid cooled heat dissipation device of claim 10, wherein:
the protruding structures are extended along an length direction of the heat dissipation fins.

13. The liquid cooled heat dissipation device of claim 10, wherein:
the liquid cooled heat dissipation device further comprises a liquid injection hole formed on the base and a liquid injection tail tube configuring to seal the liquid injection hole.

* * * * *